United States Patent [19]
Cleveland et al.

[11] Patent Number: 5,852,582
[45] Date of Patent: Dec. 22, 1998

[54] NON-VOLATILE STORAGE DEVICE REFRESH TIME DETECTOR

[75] Inventors: Lee E. Cleveland, Santa Clara; Yuan Tang, San Jose; Jonathan Su, Sunnyvale; Chi Chang, Redwood City; Chung K. Chang, Santa Clara, all of Calif.

[73] Assignee: Advanced Micro Devices, Inc., Sunnyvale, Calif.

[21] Appl. No.: 801,305

[22] Filed: Feb. 18, 1997

[51] Int. Cl.$^6$ ........................................... G11C 13/00
[52] U.S. Cl. ........................................... 365/222; 365/185.25
[58] Field of Search ........................... 365/185.25, 149, 365/222

[56] References Cited

U.S. PATENT DOCUMENTS 3,737,879  6/1973  Greene et al. ................. 365/185.25
5,347,486  9/1994  Urai ............................ 365/185.25

*Primary Examiner*—Terrell W. Fears
*Attorney, Agent, or Firm*—Fliesler, Dubb, Meyer & Lovejoy

[57] ABSTRACT

A timing apparatus for monitoring when a memory array in a non-volatile storage device needs to be refreshed includes a programmable semiconductor device and detecting means for detecting when the amount of charge on the programmable semiconductor device has diminished to at most a threshold amount. In one embodiment, the programmable semiconductor device is a floating gate transistor programmed by adding charge to the floating gate. The detecting means monitors the $I_{DS}$ current of the transistor and determines an array refresh time when more than a negligible amount of $I_{DS}$ current is detected.

27 Claims, 4 Drawing Sheets

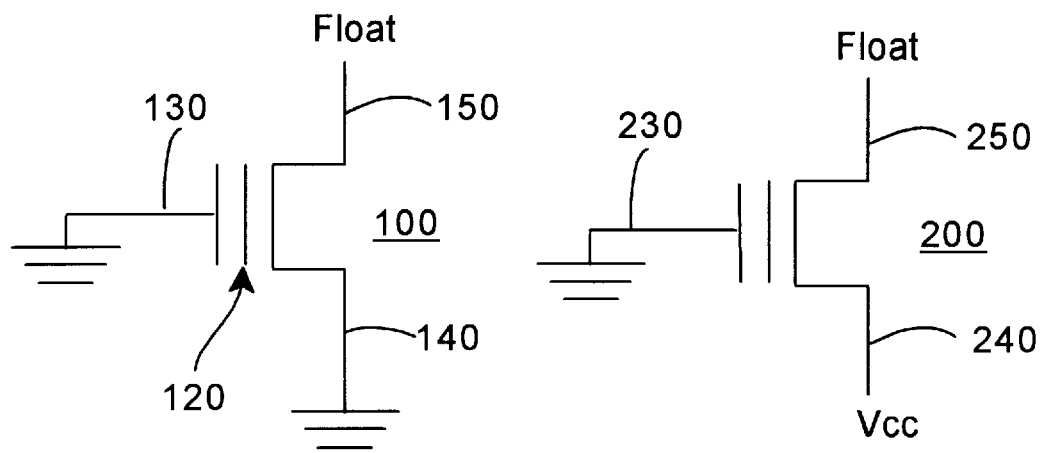
Fig. 3
Fig. 4
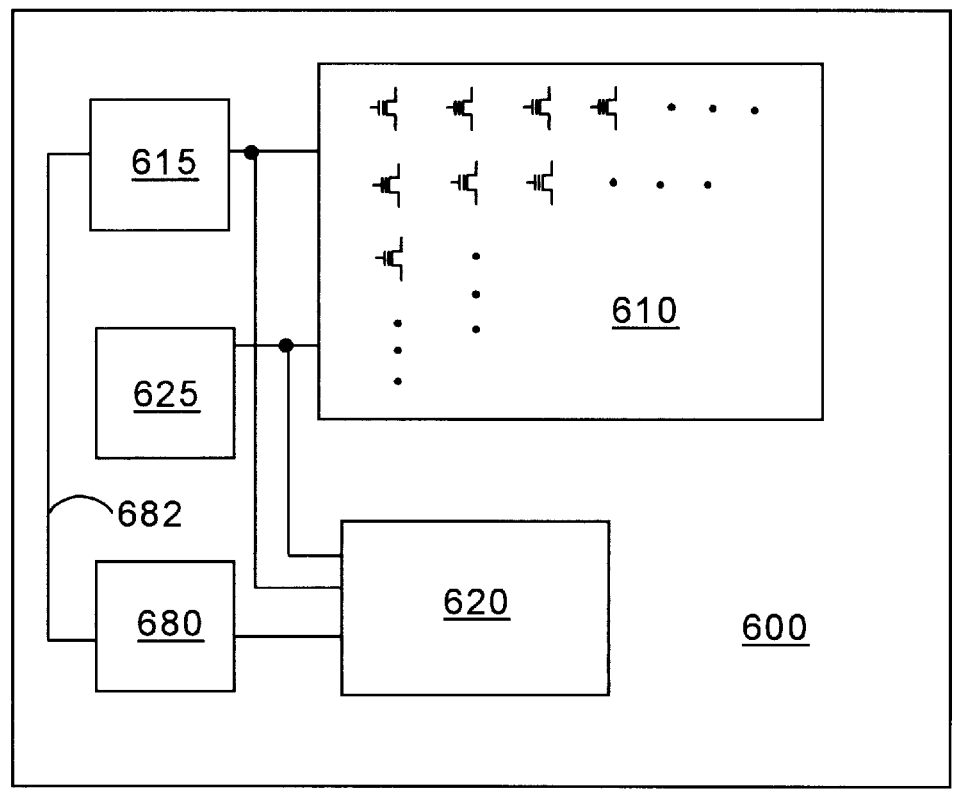
Fig. 5

NON-VOLATILE STORAGE DEVICE REFRESH TIME DETECTOR

BACKGROUND OF THE INVENTION

1. Field of Invention

The invention relates to non-volatile storage devices and in particular to devices that monitor memory cell charge leakage.

2. Background

Programmable read-only memories (PROMs), electrically erasable and programmable read-only memories (EEPROMs), flash EEPROMs, and other storage devices are common in electronic circuits and are useful in storing and maintaining information even when the device housing the electronic circuit is turned off. Thus, they are often referred to as non-volatile storage devices.

Each non-volatile storage device is an integrated circuit and generally includes an array of memory cells, where each cell stores a bit of information, and also includes other logic for reading the stored information. Many non-volatile storage devices are also programmable and/or erasable, and thus also include logic for performing program and erase functions. Flash EEPROMs in particular are generally capable of electrically programming and reading individual cells in an array and are also generally capable of erasing the entire memory cell array simultaneously.

Each memory cell in an array is generally formed of a floating gate transistor in which data bits are stored by charging or discharging the floating gate. A cross-section of a typical floating gate transistor 100 is shown in FIG. 1. A floating gate 120 is formed over substrate 110 and control gate 130 is formed over floating gate 120. Floating gate 120 and control gate 130 are each often formed of polysilicon. Floating gate 120 is insulated from the substrate 110 by an insulating layer 115. Likewise, control gate 130 is insulated from floating gate 120 by insulating layer 125. Often insulating layers 115 and 125 are formed of oxides, but can also be formed of other suitable insulating material. Floating gate 120 defines, by its length, a channel region 117 in substrate 110 which separates source region 140 from drain region 150. Source and drain regions 140 and 150 are generally regions which have a higher concentration of dopants than substrate 110. FIG. 2 shows a schematic depiction of the memory cell of FIG. 1.

To operate the memory cell in its natural state, i.e., the state in which the cell resides before any program or erase steps take place, typically a small positive voltage is applied to the drain 150 while the source 140 is brought to a ground potential. This small positive voltage is sometimes referred to as $V_{CC}$ and is typically 5v, 3.3v, or 2.5v, but can be higher or lower for particular applications. When a read voltage is applied to the control gate 130, the memory cell becomes conductive; that is, a current ($I_{DS}$) flows between the drain 150 and the source 140. This state is often referred to as turning on the cell. A typical read voltage is $V_{CC}$ but can be other voltage levels in various circumstances.

The act of charging (or adding electrons) to the floating gate is referred to herein as "programming" the memory cell. Often to program the memory cell, a technique referred to as hot-electron injection is used which establishes a large positive voltage from the gate to the substrate and a positive voltage from the drain to the source. For instance, to program cell 100 of FIG. 1 using hot-electron injection, a voltage $V_D$ is applied to drain 150, a voltage $V_G$ (which is greater than $V_D$) is applied to the control gate 130, and a ground voltage potential is applied to the source 140. Typical voltages may be 12v for $V_G$ and 7v for $V_D$. The voltage $V_D$ on the drain causes electrons to flow into channel region 117, while the voltage $V_G$ on the control gate 130 attracts the electrons in the channel region and causes the electrons to inject onto the floating gate 120. The addition of electrons to the floating gate causes the threshold voltage (the minimum voltage applied to the control gate at which the transistor will become conductive) to increase. Thus, when a read voltage is applied to the control gate 130 of a programmed memory cell, the read voltage is not generally high enough to cause a sufficient $I_{DS}$ current to flow, and thus the memory cell does not turn on.

The act of discharging (or removing electrons) from the floating gate is referred to herein as "erasing" the memory cell. Often to erase memory cells a technique referred to as Fowler-Nordheim tunneling is used. Fowler-Nordheim tunneling is often accomplished between the floating gate and the source, although it can also occur between the floating gate and the channel region of the substrate, and usually entails establishing a large positive voltage from the source to the gate. For instance, to erase a cell 100 of FIG. 1 using Fowler-Nordheim tunneling, a voltage $V_G$ of approximately −12v is applied to control gate 130, a voltage $V_S$ of approximately 7v is applied to source 140, while the drain 150 is left floating. Alternatively, a ground potential voltage is applied to control gate 120, a voltage $V_S$ of 12v is applied to source 140, while the drain is left floating. With a large positive voltage established from the source to the gate, an electric field is formed across the oxide, which, when large enough, causes electrons to tunnel from the floating gate through the oxide to the source.

Once programmed, a non-volatile memory cell such as that shown in FIG. 1 maintains the data programmed for long periods of time in power off as well as power on states. Despite its non-volatile nature, however, electrons added to the floating gate will tend to leak back to the substrate (including the source and drain regions), attempting to return the cell to its natural and generally ionically balanced state. As the electrons leak back, the threshold voltage of the cell gradually decreases, and may eventually allow a programmed cell to turn on when a read voltage is applied.

Therefore, a memory cell occasionally needs to be refreshed, otherwise stored data may become incorrect and the storage device unreliable. However, the discharge process tends to be extremely slow, taking weeks, months, even years before any effect is seen in the memory cell storage performance. Thus, refreshing only needs to occur after very long time intervals.

In order to periodically refresh a non-volatile storage device, a timing mechanism which periodically produces a refresh signal is beneficial. Unfortunately, most conventional timing methods are impractical to use for timing long periods required between non-volatile device refresh times. For instance, typically an oscillator and counter are used for many timing applications. To maintain a continuous count over a period of weeks, let alone years, however, would require a very large capacitance to achieve a low enough frequency to maintain a very slow count and/or a large amount of circuitry to obtain the large number of digits which would have to be reached. Thus, oscillators and/or counters are too bulky and consume too much power for timing in most non-volatile storage devices, which are typically designed to consume as little power and take up as little space as possible. Thus, many non-volatile storage device producers often ignore the need to periodically refresh non-volatile memory cells.

Thus, it is desirable to develop a way to determine when a memory cell and/or memory array should be refreshed in order to improve the reliability of non-volatile storage devices without adding bulky circuitry that consumes significant amounts of power.

SUMMARY OF THE INVENTION

In order to detect when a memory array needs to be refreshed and to overcome the problems of conventional timing circuitry, a system in accordance with the invention generally utilizes a floating gate transistor as a timing cell where the timing cell is similar to memory cells to be monitored. The timing cell is programmed and then, in a power-down or standby state, is placed in a state that favors discharge at a faster rate than that of memory cells. When the storage device is brought into a power-up state, the timing cell is monitored for charge leakage. When enough charge has leaked from the timing cell's floating gate to allow more than a negligible current to flow between the source and drain of the timing cell, too much discharge has been detected, and refresh of the memory cells is indicated.

A system in accordance with the invention is advantageous in that only a single transistor is required to act as a refresh timer which operates over days, weeks, or even months.

Such a system is further advantageous in that it requires low power.

Finally, such a system is also relatively easy to manufacture.

BRIEF DESCRIPTION OF THE DRAWINGS

The present invention is described with respect to particular exemplary embodiments thereof, and reference is accordingly made to the drawings (which are not necessarily drawn to scale) wherein like numbers denote like parts, in which:

FIG. 3 is a schematic depiction of the memory cell of FIG. 1 in a power down and/or standby state;

FIG. 4 is a schematic depiction of a timing cell in accordance with the invention in a power down and/or standby state;

FIG. 5 is a block diagram of a non-volatile storage device in accordance with the invention;

DETAILED DESCRIPTION

Over time, programmable memory cells in non-volatile storage devices, such as flash EEPROMS, experience charge leakage. FIG. 3 shows the memory cell of FIG. 2, in a power-down and/or low power standby state. As used herein, a power-down and/or standby state is a low current state. In the power-down or stand-by state, source 140 and control gate 130 are each coupled to a ground potential while the drain 150 is left to float. If programmed and then left in the state of FIG. 3 over a long period of time, the floating gate 120 will gradually discharge. Other states of a memory cell also allow charge leakage. However, the state shown in FIG. 3 tends to promote discharge at a faster rate than other states.

Figure 1:
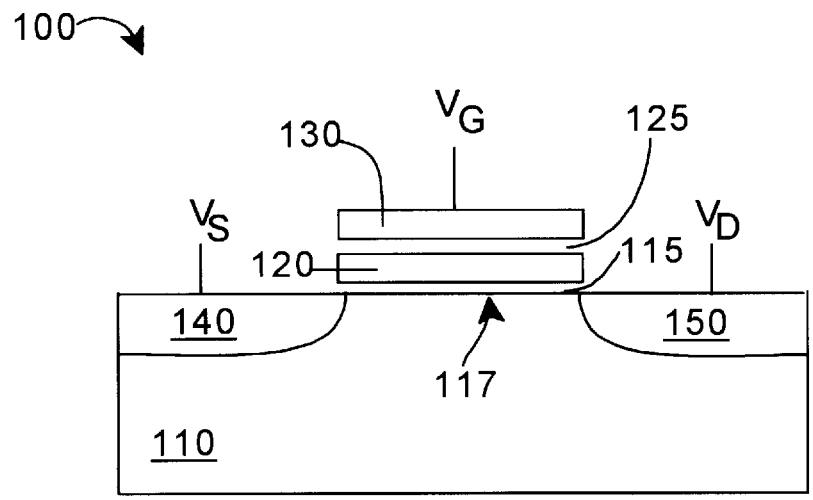
FIG. 1 is a cross-sectional view of a memory cell.
Figure 2:
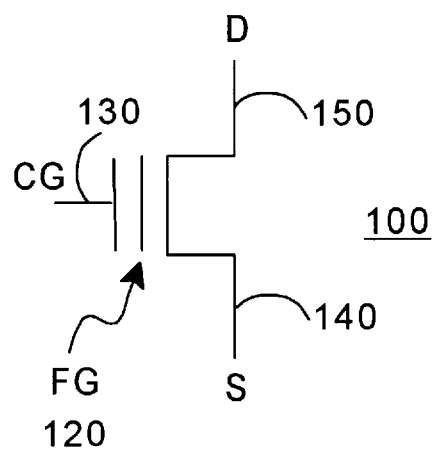
FIG. 2 is a schematic depiction of the memory cell of FIG. 1.

To monitor the array cell 100 of FIGS. 2 and 3 for charge leakage, a timing cell 200 in accordance with the invention is utilized and is shown in FIG. 4. Timing cell 200 is similar in all respects to memory cell 100 shown in FIGS. 2 and 3. In a power-down or standby state, however, source 240 is coupled to a small positive voltage (e.g., $V_{CC}$), control gate 230 is coupled to a ground potential, while drain 250 is left to float. $V_{CC}$ is often defined as 5v, 3.3v, or 2.5v, but other voltages are also acceptable. When timing cell 200 is put in the condition shown in FIG. 4, the timing cell will discharge at a faster rate than a memory cell in the state shown in FIG. 3. Thus, when the memory array is brought into a power-down or standby state, a timing cell 200 is brought into the state shown in FIG. 4.

The discharge rate of timing cell 200 can be easily altered to a slower discharge rate simply by varying the voltage potential coupled to source 240 (e.g., by lowering the voltage) or control gate 230 (e.g., by raising the voltage potential). In either case, the electric field formed between the control gate and the source will be reduced. The discharge rate, of course, could be raised in a similar manner (e.g., by increasing the voltage coupled to source 240).

In FIG. 5, a non-volatile storage device 600 is shown which includes a memory array 610 and a refresh timing circuit 620 in accordance with the invention. The memory array 610 is generally composed of an array of cells 100 as shown in FIG. 2. The refresh timing circuit 620 includes timing transistor 200 (FIG. 4). While shown in FIG. 5 as physically separate, all or part of refresh timing circuit 620, including timing transistor 200, can be incorporated within memory array 610 in other embodiments of the invention. Device 600 is also shown with program logic 615 coupled to array 610 and refresh timing circuit 620, read voltage generator 625 coupled to array 610 and refresh timing circuit 620, and refresh logic 680 coupled to refresh timing circuit 620 and program logic 615. While shown in FIG. 5 as part of device 600, all or part of program logic 615, read voltage generator 625, and/or refresh logic 680 can be implemented apart from device 600 and are shown as part of device 600 only for convenience.

Figure 6:
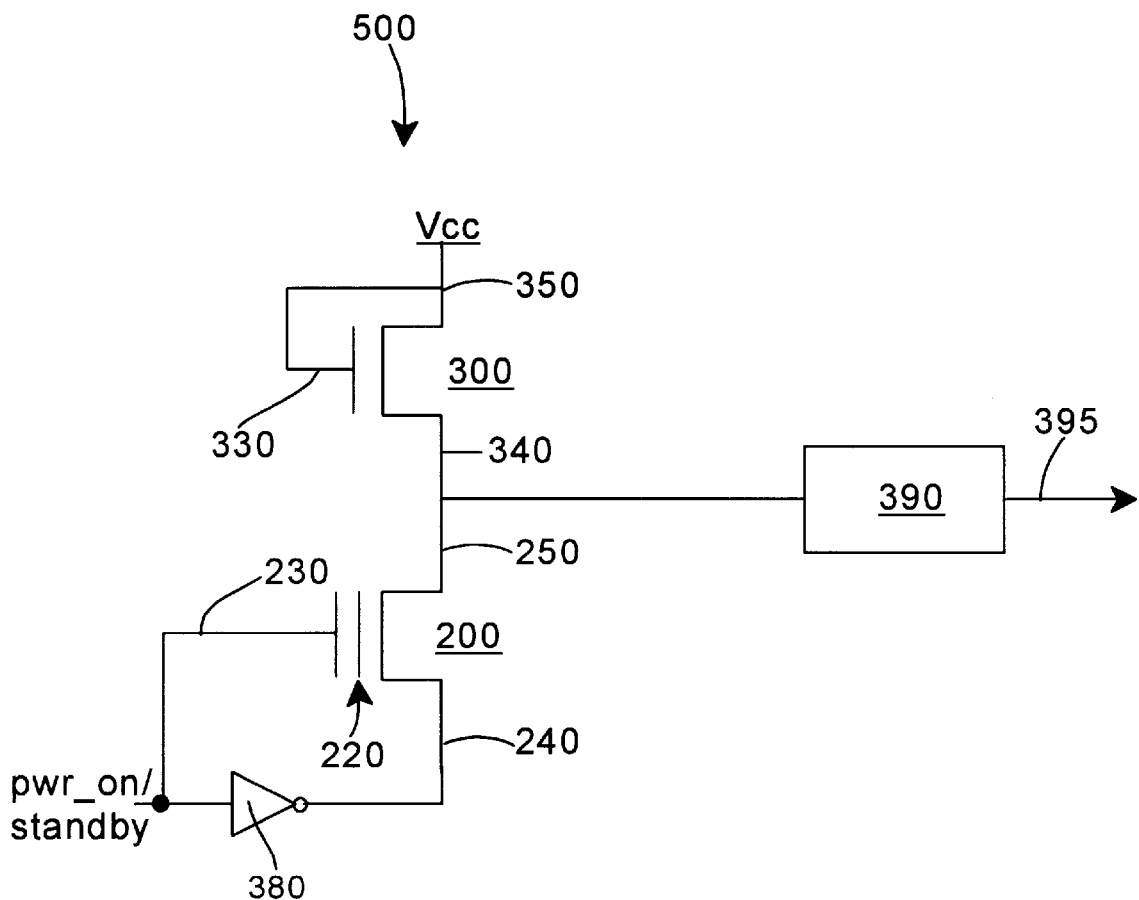
FIG. 6 is a schematic block diagram of one embodiment of a refresh timing circuit in accordance with the invention.

FIG. 6 demonstrates one embodiment of refresh timing circuit 620 (FIG. 5). FIG. 6 shows timing cell 200 in circuit 500. Timing cell 200 is coupled between transistor 300 and inverter 380: the drain 250 of cell 200 is coupled to the source 340 of transistor 300, while the source 240 is coupled to the output of inverter 380. Control gate 230 of cell 200 is coupled to a power-on/standby# signal, which is also coupled to the input of inverter 380. The drain of transistor 300 is coupled to $V_{CC}$. The gate 330 of transistor 300 is coupled to the drain 350 of transistor 300. Transistor 300 generally acts as a pull-up to voltage potential $V_{CC}$ as is generally known in the art. The drain 250 of cell 200 is further coupled to detector circuit 390. The output 395 of detector circuit 390 is used to carry a signal indicative of whether a refresh of array 610 should occur.

In order to implement a circuit 500 as a refresh timing circuit 620 for memory array 610, first all memory cells 100 in the memory array which are to be programmed should be programmed, making those memory cells non-conductive when a read voltage is applied to the respective control gates 130. In addition, timing cell 200 is also programmed. When brought to a power-down and/or a low power standby state, the respective sources 140 and control gates 130 of the memory cells 100 in memory array 610 will be coupled to ground as shown in FIG. 3. Simultaneously, in circuit 500, control gate 230 is brought to a low or ground potential while standby# is inverted through inverter 380 bringing a $V_{CC}$ or high voltage potential to source 240. Thus, in a standby mode, cell 200 will generally discharge faster than the cells 100 in memory array 610.

When brought into a power-up state, a $V_{CC}$ or high voltage will be coupled to control gate 230 of cell 200 while a ground or low potential will be brought to source 240 of transistor 200. In this state, timing cell 200 is in a read and/or verify mode and the current flowing from drain to source, $I_{DS}$, can be monitored to determine if the cell has become too conductive, i.e., if too much charge has leaked away from the floating gate 220. Detector circuit 390 will detect if a significant amount of current is flowing from drain to source in timing cell 200 and, if so, output a signal on line 395 indicating that a refresh of memory array 610 is required. A refresh cycle will then be performed, rewriting data to both memory array 610 and also recharging the floating gate 220 of timing cell 200.

In one embodiment of the invention, to determine if too much charge has leaked from floating gate 220, the output voltage at drain 250 is monitored. When cell 200 turns on (when a significant amount of $I_{DS}$ current is flowing) a low voltage will be output to detector 390 from drain 250. If no significant leakage has taken place, a high signal will appear on line 250 because an insufficient $I_{DS}$ current will be flowing to turn on cell 200.

Figure 7:
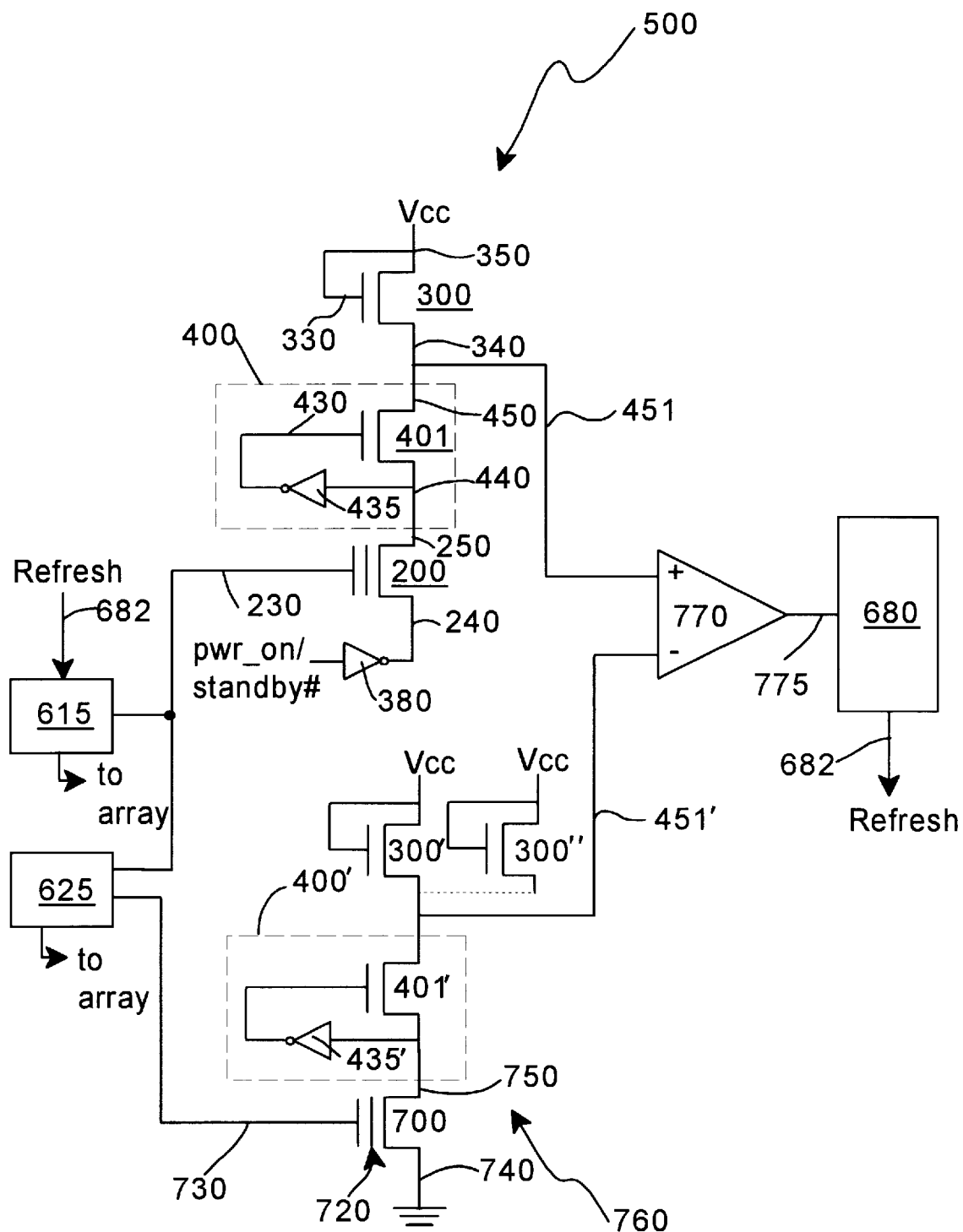
FIG. 7 is a schematic block diagram of another embodiment of a refresh timing circuit in accordance with the invention.

An embodiment of detector circuit 390 is shown in FIG. 7. Detector circuit 390 includes reference circuit 760 as well as comparator 770. Circuit 500 is also shown in FIG. 7, but is shown in FIG. 7 with a biasing amplifier 400 coupled between timing cell 200 and pull-up transistor 300 formed of transistor 401 coupled to inverter 435. Biasing amplifier 400 is optional in various embodiments of the invention and causes the voltage swing at source 440 to be less than the voltage swing at drain 450. In addition, FIG. 7 also shows programming circuit 615, read voltage generator 625 and refresh logic 680, each of which may be included in whole or in part on nonvolatile device 600.

Circuit 760 is similar to circuit 500, including a biasing amplifier 400' (if biasing amplifier 400 is used in circuit 500) and a pull-up transistor 300', except timing cell 200 is replaced with reference cell 700, which has a source 740 coupled to a ground potential. Reference cell 700 is similar in all respects to timing cell 200 except that floating gate 720 of reference cell 700 will not be subsequently programmed or erased, remaining in its natural state. Thus, while timing cell 200 may be located within or outside array 610 (FIG. 6), reference cell 700 should be isolated from memory array 610 because reference cell 700 is not subject to program and erase conditions.

Outputs 451 and 451' are taken from the drains 450 and 450', respectively. If biasing amplifiers 400 and 400' are not utilized, outputs 451 and 451' would be taken from drains 250 and 750 respectively. Each output 451 and 451' is coupled to comparator 770. The output 775 of comparator 770 is coupled to refresh logic 680, which produces a refresh signal on line 682. Programming circuit 615 is also coupled to refresh signal 682 from refresh logic 680.

To operate the refresh timing circuit shown in FIG. 7, memory cells in array 610 which are to be programmed are programmed with program circuitry 615. In addition, timing cell 200 is also programmed via programming circuitry 615. Reference cell 700 is not programmed.

When brought to a power down and/or low power standby state, the source 240 of cell 200 is brought to a high or $V_{CC}$ state while the control gate 230 is brought to a low or ground state, placing cell 200 in a condition favoring floating gate discharge. In a power down or standby state, the control gate 730 of reference cell 700 is also brought to a low or ground state.

On power up, timing cell 200 is verified. A read voltage from read voltage generator 625 is applied to the control gate 230 of timing cell 200 while at the same time a read voltage is also applied to control gate 730 of reference cell 700. If the reference current generated in reference cell 700 is less than the current generated in the timing cell 200, too much leakage has occurred and the output of comparator 770 will so indicate on line 775. Refresh logic 680 thus generates a refresh signal 682 to programming circuitry 615 to indicate that array 610 should be refreshed as well as timing cell 200. In this manner, detector circuitry can monitor $I_{DS}$ in cell 200 and signal a refresh condition when a maximum discharge threshold (i.e., a minimum $I_{DS}$ current) has been reached or surpassed even if $I_{DS}$ is still insufficient to fully turn on cell 200.

Generally, when cell 200 is programmed, cell 200 will conduct more current and thus initially produce a higher voltage on line 451 then will be produced on line 451'. Thus, in some embodiments of the invention, additional pull-up transistors 300'' are utilized in circuit 760 in order to achieve conditions on line 451' which appear to match the programmed initial conditions on line 451.

In one embodiment of the invention in order to conduct a refresh of memory array 610, the contents of memory array 610 are read into a RAM or other storage device located on or apart from non-volatile device 600 and then the information is reprogrammed into memory array 610.

As it will be clear to one with skill in the art the system in accordance with the present invention has several advantages. First, only a single memory cell is required to act as a timing circuit as compared with an impractically large capacitance and/or a bulky amount of circuitry needed to build a traditional counter which can count long enough to generate a refresh signal only when needed. In addition, very low power is required for such a timing cell during its long discharge period, and thus can easily be implemented with a low power standby mode. Moreover, such a timing circuit is easy to build, since it is structurally identical to memory cells in array 610. Finally, the discharge time period for timing cell 200 tends to be easily adjusted simply by changing the voltage applied to source 240 of timing cell 200.

It should be understood that the particular embodiments described above are only illustrative of the principles of the present invention, and various modifications could be made by those skilled in the art without departing from the scope and spirit of the invention. For instance, while n-channel transistor devices are shown and described, p-channel devices could be substituted for some or all of the n-channel devices. Thus, the scope of the present invention is limited only by the claims that follow.

What is claimed is:

1. A timing apparatus, comprising:
    a programmable semiconductor device, wherein said device is programmed by the addition of charge;
    a discharge detector, in electrical communication with said programmable semiconductor device, to detect when the amount of charge on said programmable semiconductor device has diminished to at most a threshold amount; and an output, in electrical communication with said discharge detector, for carrying a signal indicative of whether a second programmable semiconductor device needs to be refreshed.

2. The apparatus of claim 1, wherein said programmable semiconductor device is placed in a condition favoring charge diminishment.

3. The apparatus of claim 2, wherein said programmable semiconductor device is placed in a condition favoring charge diminishment in a first state and, in a second state, is placed in a verify condition, and wherein said discharge detector detects during said second state when the amount of charge on said programmable semiconductor device has diminished to at most a threshold amount.

4. The apparatus of claim 3, wherein said discharge detector is further in electrical communication with memory array refresh logic and said discharge detector activates said signal on said output when the amount of charge on said programmable semiconductor device has diminished to at most said threshold amount.

5. A timing apparatus for use with a memory array, comprising:
   a transistor having a floating gate, a control gate, a source, and a drain, said transistor capable of being programmed by adding charge to said floating gate;
   discharge detecting means for detecting whether the amount of charge on said floating gate has diminished to at most a threshold amount; and
   an output, coupled to said discharge detecting means, for carrying a signal indicative of whether said memory array needs to be refreshed.

6. The apparatus of claim 5, wherein, in a leakage mode of operation, the control gate, the drain, and the source of said transistor are coupled to respective voltage potentials which favor charge diminishment from said floating gate.

7. The apparatus of claim 6, wherein, in said leakage mode of operation, the control gate is coupled to a first voltage potential, wherein the source is coupled to a second voltage potential higher than said first voltage potential, and wherein the drain is floating.

8. The apparatus of claim 6, wherein, in a verify mode of operation, the control gate, the drain, and the source of said transistor are coupled to respective voltage potentials which permit said discharge detecting means to detect whether the amount of charge on said floating gate has diminished to at most a threshold amount.

9. The apparatus of claim 8, wherein, in said verify mode of operation, the control gate is coupled to a third voltage potential, wherein said source is coupled to a fourth voltage potential lower than said third voltage potential, and said drain is coupled to a fifth voltage potential approximately equivalent to said third voltage potential.

10. The apparatus of claim 8, wherein said discharge detecting means detects current flow between said source and said drain in said verify mode of operation.

11. The apparatus of claim 10, wherein said threshold amount is determined by when more than a negligible amount of current flows between said source and said drain.

12. The apparatus of claim 5, wherein said discharge detecting means is for detecting when the amount of charge on said floating gate has diminished to at most a threshold amount after a period of weeks.

13. A nonvolatile storage system, comprising:
   a memory array including a plurality of programmable semiconductor devices for storing information, wherein said semiconductor devices are programmed by the addition of charge;
   an additional programmable semiconductor device, wherein said additional device is programmed by the addition of charge;
   a discharge detector, in electrical communication with said additional programmable semiconductor device, to detect when the amount of charge in said additional programmable semiconductor device has diminished to at most a threshold amount and to signal when said memory array needs to be refreshed.

14. The system of claim 13, wherein:
   said additional programmable semiconductor device and each of said programmable semiconductor devices in said plurality of programmable semiconductor devices includes a transistor having a floating gate, a control gate, a source, and a drain, and wherein said additional programmable semiconductor device and each of said programmable semiconductor devices in said plurality of programmable semiconductor devices is programmed by adding charge to the respective floating gates;
   said discharge detector to detect when the amount of charge on the floating gate of said additional programmable semiconductor device has diminished to at most a threshold amount.

15. The system of claim 14, wherein, in a leakage mode of operation, the control gate, the drain, and the source of the transistor of said additional programmable semiconductor device are coupled to respective voltage potentials which favor charge diminishment from said floating gate.

16. The system of claim 15, wherein the control gate of the transistor of said additional programmable semiconductor device is coupled to a first voltage potential, wherein the source of the transistor of said additional programmable semiconductor device is coupled to a second voltage potential higher than said first voltage potential, and wherein the drain of the transistor of said additional programmable semiconductor device is floating.

17. The system of claim 15, wherein, in a verify mode of operation, the control gate, the drain, and the source of the transistor of said additional programmable semiconductor device are coupled to respective voltage potentials which permit said discharge detector to detect when the amount of charge on said floating gate has diminished to at most a threshold amount.

18. The system of claim 17, wherein the control gate of the transistor of said additional programmable semiconductor device is coupled to a third voltage potential, wherein said source of the transistor of said additional programmable semiconductor device is coupled to a fourth voltage potential lower than said third voltage potential, and said drain of the transistor of said additional programmable semiconductor device is operably coupled to a fifth voltage potential approximately equivalent to said third voltage potential.

19. The system of claim 17, wherein said discharge detector detects current flow between said source and said drain of the transistor of said additional programmable semiconductor device in said verify mode of operation.

20. The system of claim 19, wherein said threshold amount is determined by when more than a negligible amount of current flows between said source and said drain of the transistor of said additional programmable semiconductor device.

21. The system of claim 13, further comprising:
   refreshing means, coupled to said discharge detector, for receiving a signal from said discharge detector indicative of whether said memory array needs to be refreshed and for refreshing said memory array.

22. A method of determining when a memory array needs to be refreshed, wherein said memory array includes a plurality of programmable semiconductor devices, comprising the steps of:

programming an additional programmable semiconductor device, wherein said additional programmable semiconductor device is separate from said plurality of programmable semiconductor devices, wherein said additional programmable semiconductor device includes a transistor having a floating gate, a control gate, a source, and a drain, and wherein programming includes adding charge to said floating gate;

allowing said floating gate to at least partially discharge;

detecting when said floating gate has discharged at least a threshold amount;

indicating, when said floating gate has discharged at least a threshold amount, that said memory array needs to be refreshed.

23. The method of claim 22, wherein said step of allowing said floating gate to at least partially discharge, includes placing said transistor in a condition which favors discharge from said floating gate.

24. The method of claim 22, wherein said step of detecting when said floating gate has discharged at least a threshold amount includes applying a read voltage potential to said control gate and detecting whether more than a negligible amount of current flows between the source and the drain.

25. A memory device, comprising:

a memory array, including a plurality of programmable semiconductor devices;

a timing circuit, including a transistor having a floating gate, a control gate, a source, and a drain, said floating gate capable of storing charge; and a discharge detector in electrical communication with said timing circuit.

26. The memory device of claim 25, wherein said discharge detector includes:

a reference circuit; and a comparator, having a first input in electrical communication with said reference circuit and having a second input in electrical communication with said timing circuit, and having an output coupled to refresh logic.

27. The memory device of claim 26, wherein said reference circuit is equivalent in design to said timing circuit.

* * * * *